Figure 1:
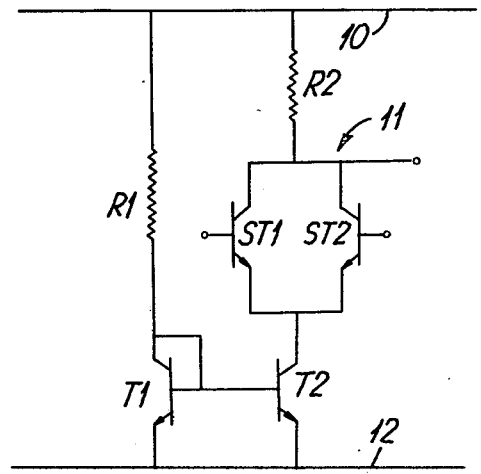

United States Patent [19]
Colaco

[11] 4,145,621
[45] Mar. 20, 1979

[54] TRANSISTOR LOGIC CIRCUITS

[75] Inventor: Stephen F. Colaco, Manchester, England

[73] Assignee: Ferranti Limited, Hollinwood, England

[21] Appl. No.: 650,032

[22] Filed: Jan. 19, 1976

Related U.S. Application Data

[63] Continuation of Ser. No. 504,731, Sep. 10, 1974, abandoned, which is a continuation of Ser. No. 336,373, Feb. 27, 1973, abandoned.

[30] Foreign Application Priority Data

Mar. 4, 1972 [GB] United Kingdom ............... 10200/72

[51] Int. Cl.² ...................... H03K 19/08; H03K 19/34
[52] U.S. Cl. .................................... 307/215; 307/213; 307/297; 307/299 B; 357/48; 357/86

[58] Field of Search ................... 307/213, 215, 299 B, 307/297; 357/48, 36

[56] References Cited

U.S. PATENT DOCUMENTS

| 3,590,274 | 6/1971 | Marley | 307/215 |
| 3,668,430 | 6/1972 | Kan | 307/235 |
| 3,694,762 | 9/1972 | Mulder | 357/36 |
| 3,787,737 | 1/1974 | Mukai | 307/215 |
| 3,865,648 | 2/1975 | Castrucci et al. | 357/46 |

*Primary Examiner*—William D. Larkins
*Attorney, Agent, or Firm*—Cameron, Kerkam, Sutton, Stowell & Stowell

[57] ABSTRACT

A transistor logic circuit includes a constant current source in the form of a current mirroring arrangement connected to a logical gating combination of switching transistors, the arrangement being such that the switching transistors do not saturate.

21 Claims, 4 Drawing Figures

TRANSISTOR LOGIC CIRCUITS

This is a continuation of application Ser. No. 504,731, filed Sept. 10, 1974, which in turn is a continuation of application Ser. No. 336,373, filed Feb. 27, 1973, both now abandoned.

This invention relates to transistor logic circuits and in particular to such circuits suitable for incorporation in a monolithic semiconductor body with many hundreds of identical or closely resembling logic circuits.

Such circuits desirably have performance characteristics which enable them to operate satisfactorily when supplied with electrical energy from a low voltage source, and which enable their logic states to be determined in input signals the voltage levels of which may change within only a small range of values.

It is required that such a circuit has associated with it as small a value as possible for the product of the electrical power consumed by the circuit and its propagation delay.

Such a circuit may include logical gating combination of switching transistors comprising a NOR gate having a plurality of inputs, each different input being associated individually with a different switching transistor. In the operation of the logical gate, each input is capable of being at one of two possible potential levels or states. In one such state the input is at a higher potential level then when it is in the other state, and causes the associated switching transistor to be rendered conductive, i.e., to be switched ON. When the input is in the other state the transistor is non-conductive, i.e., is switched OFF. A common output of the logical gate is also capable of being at two possible potential levels or states. In one such state the common output is at a higher potential level than when in the other state. When any one of the inputs of the logical gate is at the higher potential level of its two possible states, rendering the associated switching transistor conductive, the output of the logical gate is in the state having the lower potential level; and vice versa.

If a switching transistor is saturated with switched ON the logical gate, and so also a transistor logic circuit including such a switching transistor, dissipates more energy than would otherwise be the case, and the switching time of the transistor is increased.

It is an object of the present invention to provide a novel and advantageous transistor logic circuit.

According to the present invention a transistor logic circuit which is to be supplied with electrical energy from a low voltage source, the circuit including a constant current source to drive a logical gating combination of switching transistors has a constant source in the form of a current mirroring arrangement comprising, or equivalent to, a circuit including a first transistor having a collector collected to the base of the transistor, and via a load resistor to be connected to a source maintained at a first potential level, and a circuit including a second transistor having a collector connected via a logical gating combination of switching transistors to the source maintained at the first potential level, the emitters of the first and second transistors are connected to a point to be maintained at a second potential level lower than the first potential level, and the bases of the first and second transistors are connected together, the arrangement being such that the switching transistors do not saturate when rendered conductive.

The constant current source may comprise a transistor having a high inverse current gain value and with a first, emitter and at least one second emitter, the first emitter to be connected to the source maintained at the first reference potential level via a load resistor, and is connected to the base of the transistor, the collector is connected to the point to be maintained at the second potential level, and the second emitter is connected to the logical gating combination of switching transistors. Thus, the circuit including the first emitter is equivalent to the circuit including the first transistor, and the circuit including the second emitter is equivalent to the circuit including the second transistor.

Inverse charge carrier injection is uniform within the transistor.

The multi-emitter transistor having the high inverse current gain value is, thus, arranged to conduct only in the reverse direction. However, in this specification the terms "collector" and "emitter" are used to refer to the collector and emitter of such a bi-directional transistor when capable of conducting in the forward direction.

If a plurality of logical gating combinations of switching transistors are driven by a common constant current source the energy dissipated by the transistor logic circuit is lower than would otherwise be the case.

According to another aspect the present invention comprises a semiconductor device embodying in a monolithic semiconductor body a transistor logic circuit as referred to above.

When the transistor logic circuit device embodied in the monolithic semiconductor body has a constant current source with a multi-emitter transistor with a high inverse current gain value, at least this transistor may have the so-called collector-diffusion-isolation construction, the device being formed in a semiconductor body comprising an epitaxial layer of one conductivity type, the transistor having a collector of the opposite conductivity type comprising both a heavily doped isolation barrier for the transistor and a heavily doped buried layer at the interface between the epitaxial layer and the substrate, the isolation barrier extending through the epitaxial layer into contact with the buried layer.

Desirably, within the semiconductor body, the second emitters are uniformly distributed within the base and about the first emitter.

Figure 2:
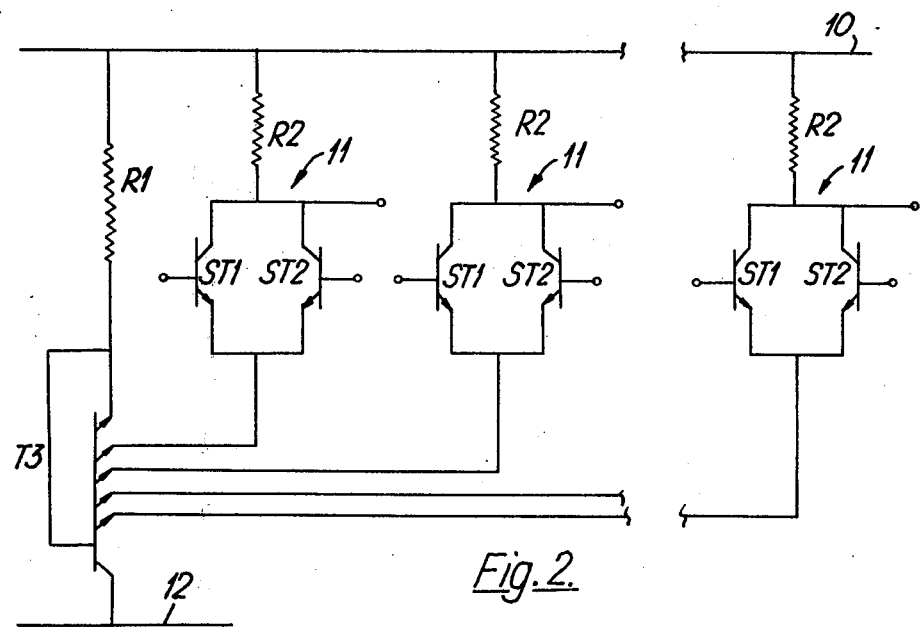
Figure 3:
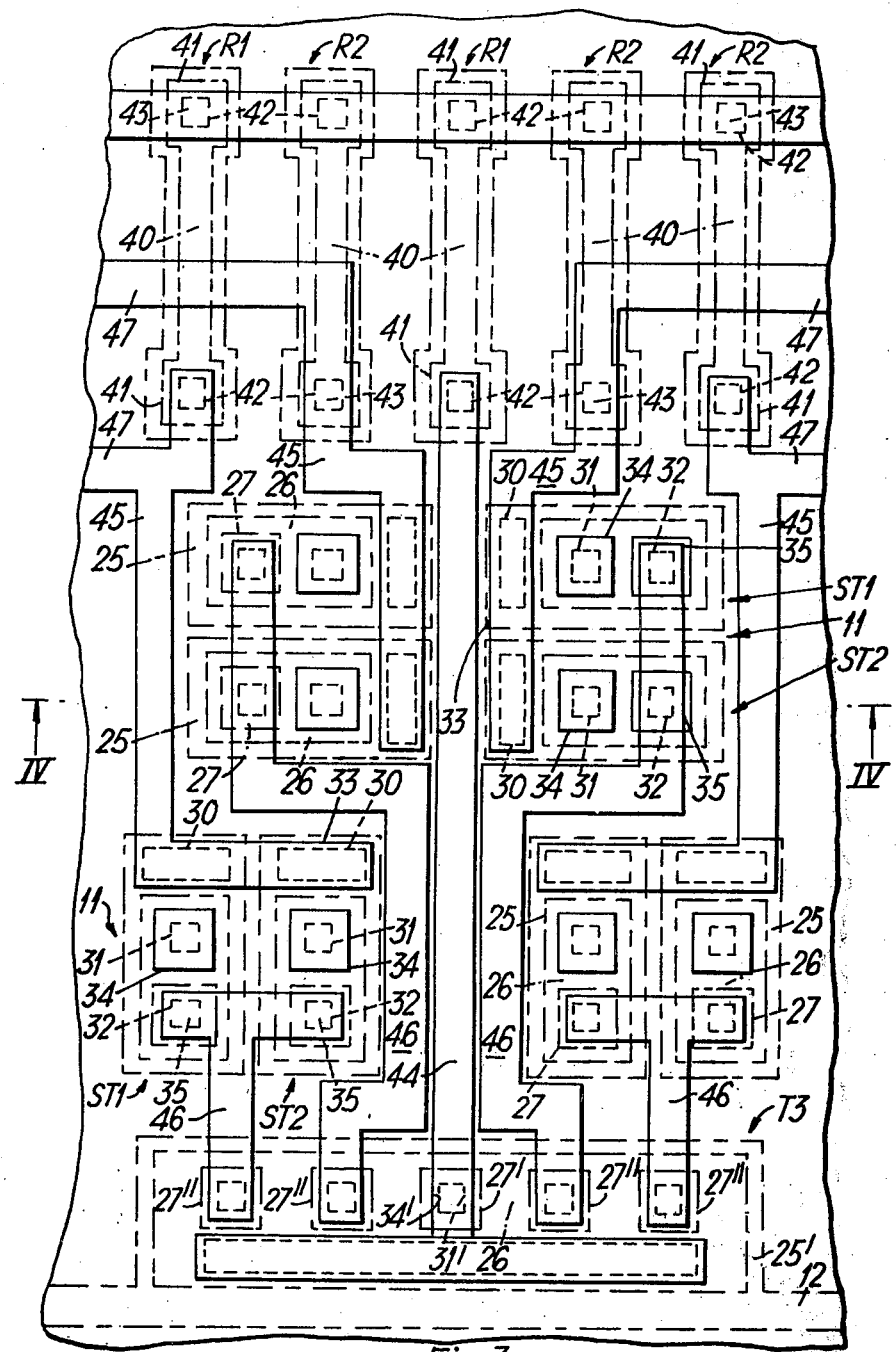
Figure 4:
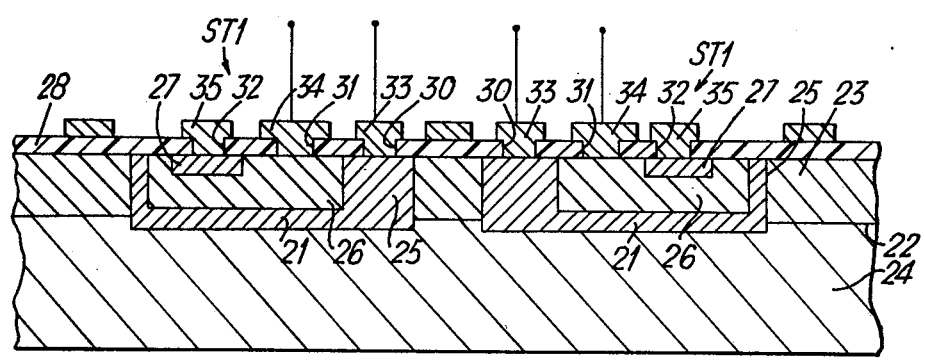

The present invention will now be described by way of example with reference to the accompanying drawings, in which FIG. 1 comprises a circuit diagram of one embodiment according to the present invention of a transistor logic circuit, FIG. 2 comprises a circuit diagram of another embodiment according to the present invention of a transistor logic circuit, FIG. 3 is a plan view of the transistor logic circuit of FIG. 2 when embodied in a semiconductor body, and FIG. 4 is a section on the line IV—IV of FIG. 3.

In the transistor logic circuit, which is to be supplied with electrical energy from a low positive voltage source, the circuit including a constant current source to drive a logical gating combination of switching transistors, and shown in FIG. 1, the constant current source in the form of a current mirroring arrangement comprises a circuit including a first N-P-N transistor T1 with a collector connected both to the base of the transistor, and via a load resistor R1 to a supply rail 10 connected to a source (not shown) maintained at a first, low positive, potential level. The constant current source also has a circuit including a second N-P-N transistor T2 with a collector connected via a logical gating combination 11 of switching transistors ST1 and ST1 and a lead resistor R2 to the rail 10. The bases of the first and second transistor T1 and T2 and connected together, and the emitters are connected to a rail 12 maintained at a second potential level. The second potential level is lower than that of the first reference potential level, and may conveniently be zero, but in any event is less positive than the first reference potential level. The transistors T1 and T2 conduct in the forward direction.

The arrangement is such that the switching transistors ST1 and ST2 do not saturate when rendered conductive, the current flowing in the circuit including the second transistor T2 being determined by the current flowing in the circuit including the first transistor T1, which is in turn determined by the magnitude of the load resistor R1.

The illustrated logical gating combination 11 of switching transistors comprises a NOR gate. The switching transistors ST1 and ST2 are connected in parallel with each other, the collectors being connected to the common load resistor R2, and the emitters being connected to the collector of the second transistor T2 of the constant current source. The base contact of each switching transistor comprises an input of the NOR gate 11, and the common output of the NOR gate is connected to the collectors of each switching transistor ST1 and ST2.

In the NOR gate 11, if either switching transistor ST1 or ST2 is switched ON by the associated input raising the base potential level from zero potential; the potential level of the common output is at the lower of two possible positive potentials. However, if both switching transistors of the NOR gate are switched OFF, both inputs being at zero potential, the potential level of the common output is at the higher positive potential level.

The use of the constant current source to drive the NOR gate, in addition to being able to prevent the switching transistors from saturating, implies that the potential level of the emitter of each switching transistor does not alter significantly when the transistor is switched ON, ensuring the satisfactory operation of the NOR gate.

The transistor logic circuit of FIG. 1 may be embodied in a semiconductor body by employing any suitable known method, and the components of the circuit may have any suitable known construction.

The transistor logic circuit shown in FIG. 1 may be modified in the way shown in FIG. 2. Components identical with or closely resembling components of FIG. 1 are given the same reference numbers in FIG. 2. However, the constant current source in the form of a current mirroring arrangement comprises a multi-emitter N-P-N multi-emitter transistor T3 with a first emitter and a plurality of second emitters, the multi-emitter transistor having a high inverse current gain value.

The first emitter is connected both to the rail 10 at the first, positive, potential level via the load resistor R1, and to the base of the transistor T3. The collector is connector to the rail 12 at a lower potential which may be zero potential. Each of the plurality of second emitters is connected individually to an associated one of a corresponding plurality of NOR gates 11, which NOR gates 11 are connected individually via a load resistor R2 to the rail 10. Thus, the circuit including the first emitter, and each circuit including a second emitter, respectively, is equivalent to the circuit including the first transistor T1 and the circuit including the second transistor T1 of the transistor logic circuit of FIG. 1. The transistor T3, however, conducts in the reverse direction.

The second emitters are identical, and because the collector of the transistor T3 is connected to the rail 12 at zero potential causing inverse charge carrier injection within the transistor to be uniform, the magnitude of the current flowing in each circuit including a second emitter is the same. Hence, the NOR gates 11 are driven in the same way as each other. Further, the magnitude of the current flowing in each circuit including a second emitter is independent of whether or not current is flowing in ay other circuit including a second emitter. There may be up to twelve NOR gates driven by the same constant current source. Thus, the energy dissipation of the transistor logic circuit is lower than would otherwise be the case.

In one particular embodiment of a transistor logic circuit according to the present invention, and as illustrated in FIG. 2, the rail 10 is maintained at the low potential level of +0.9 volts, and the potential drop across each load resistor R2 is 0.4 volts, preventing the switching transistors ST1 and ST2 from saturating. Thus, the output level of the NOR gate 11 is +0.5 volts when at least one switching transistor is conducting, but rises to +0.9 volts when both switching transistors are not conducting, which is a small change. The current flowing in the circuit including the second emitter is 1 milliampere, and the load resistor R1 is 400 ohms. The multi-emitter transistor T3 has a high inverse current gain value in the range 10 to 15.

In the transistor logic circuit of either FIG. 1 of FIG. 2 the ratio of the total emitter area at the contact-bearing faces in the circuit including the first transistor T1 or first emitter, to the total emitter area in the circuit including the second transistor T2 or each circuit including a second emitter, may be less than unity. The ratio of the currents flowing in the circuits is determined by this ratio of emitter areas. Thus, if the ratio of emitter areas is 1 to 4, each NOR gate takes a current four times that of the circuit including the first transistor T1 or first emitter. Hence, the energy dissipation of the transistor logic circuit is lower than would otherwise be the case. A ratio of emitter areas of 1 to 4 between the first emitter and the second emitter of the transistor T3 having a high inverse gain value may be obtained by having a second emitter comprising four discrete emitters coupled together, each discrete emitter being identical to the first emitter.

The transistor logic circuit of FIG. 2, and having four NOR gates 11, may be embodied in a monolithic silicon semiconductor body by employing a known method, the construction of the semiconductor device being shown in FIGS. 3 and 4. As is more clearly illustrated in FIG. 4, each switching transistor ST1 and ST2 has the so-called collector-diffusion-isolation structure with a collector comprising both a buried N+ type layer 21, at an interface 22 between a shallow P-type epitaxial layer 23 and a P-type substrate 24, and an N+ type isolation barrier 25 for the transistor. The isolation barrier 25 extends through the epitaxial layer 23 into contact with the buried layer 21. The collector 21, 25 defines a P-type base region 26 within the epitaxial layer 23. An N+ type emitter 27 for the transistor is formed within the base region 26.

A passivating layer 28 of silicon oxide is provided on the otherwise exposed surface of the epitaxial layer 23. In each switching transistor ST1 and ST2, apertures 30, 31 and 32 in the silicon oxide layer 28, respectively, expose contact regions of the collector 21, 25 base 26 and emitter 27 of each transistor. Contacts 33, 34 and 35 respectively, to the collector 21, 25, base 26 and emitter 27 of each transistor ST1 and ST2 are provided by aluminium deposited in the apertures.

For simplification, the buried N+ type layers 21 at the interface 22 of the epitaxial layer 23 and the substrate 24 are not shown in FIG. 3. However, in FIG. 3 the P-N junctions are shown in chain-dotted form, the apertures 30, 31 and 32 in the silicon oxide layer 28 are indicated by broken lines, and the contacts 33, 34 and 35, together with other contacts and the electrical interconnections referred to below, are indicated by continuous lines.

The multi-emitter transistor T3 comprising the constant current source, closely resembles each switching transistor ST1 and ST2, and has a high inverse current gain value. However, only one aperture 31' is provided for the combination of the first emitter 27' and the base 26. Thus, the aluminium within the aperture 31', indicated at 34', comprises a common contact for the first emitter 27' and the base 26, the contact spanning part of the P-N junction between the first emitter and the base. Each second emitter is indicated at 27", and are uniformly distributed within the base and about the first emitter 27'. No collector contact is provided for the multi-emitter transistor T3, the collector, indicated at 25', being integral with the rail 12 provided by a longitudinally-extending N+ type region in the epitaxial layer 23.

East resistor R1, R2 of the transistor logic circuit, which is provided simultaneously with the transistor T3, has a construction closely resembling that of switching transistor ST1 and ST2. In each resistor, however, the N+ type region corresponding to the collector defines a generally longitudinally-extending resistive portion 40 of the epitaxial layer, with enlarged end portions 41 at either end. Apertures, indicated at 42, are provided in the passivating layer 28 to expose a contact portion of each enlarged end portion of the resistor. Contacts 43 are provided in the apertures 42.

The contacts of the transistor logic circuit, and also the required electrical interconnections between the different components of the transistor logic circuit, and between the transistor logic circuit and other transistor logic circuits, e.g., the output of one logic circuit to the input of another logic circuit (not shown) which are also provided in the semiconductor body, are all provided from an initially-continuous aluminium layer. This aluminium layer is deposited on the passivating silicon oxide layer and within the apertures in this passivating layer. The aluminium layer is then etched to form the contacts and the required electrical interconnection, the contacts being shown as integral with the electrical interconnections. The electrical interconnections include the rail 10 common to one contact of each of the resistors, and a conductor 44 between the other contact of the resistor R1 and the base-first emitter contact 34' of the multi-emitter transistor T3. Conductors 45 extend between the other contacts of the other resistors R2 and the collector contacts 33 of the associated NOR gates. Conductors 46 extend between the second emitter contacts 35" of the multi-emitter transistor T3 and the emitter contacts 35 of the associated NOR gates. The base contacts 34 of each switching transistor ST1 and ST2 comprise the input to the NOR gates. The outputs of the NOR gates are provided by conductors 47 integral with the contactors 45.

Collector-diffusion-isolation transistors occupy a smaller area of the surface of the epitaxial layer or the silicon semiconductor body, and requires fewer processing steps in their fabrication, than most other known forms of transistors. Hence, it is suitable construction for a transistor logic circuit to be embodied with many hundreds of identical or closely resembling circuits in a monolithic semiconductor body.

A P+ type surface portion of the epitaxial layer remote from the substrate may be provided, this portion helping to stablise the resistor and to prevent surface invention, and causing the gain bandwidth product of the transistor to be increased.

Further, the fabrication of the transistor logic circuit in the semiconductor body is facilitated by the collector-diffusion-isolation transistor and the resistor having substantially the same construction as each other. Other types of circuit element to be included in the semiconductor body may have a similar construction. However, each circuit element to be included in the semiconductor body, conveniently, may have any suitable construction.

However, whether collector-diffusion-isolation transistors are employed or not, because transistor logic circuits according to the present invention have only a low energy dissipation, because the switching transistors do not saturate, and because the potential level change of the outputs of the NOR gates is small, many hundreds of such circuits may be embodied in a monolithic semiconductor body.

Thelogical gating combinations of switching transistors may have other suitable forms than the NOR gate having two switching transistors in parallel as described above.

What I claim is:

1. A transistor logic circuit which is to be supplied with electrical energy from a low voltage source and the different logic states of which are to be determined by input signals having voltage levels with only a small range of values, the logic circuit consisting of a constant current source and a plurality of logic gates each including only a gating combination of switching transistors connected in parallel with each other and in series with a load resistor, the load resistor also being connected to a point to be maintained at a predetermined potential level by the low voltage source, each said gating combination having a common output connected to the collector of each switching transistor of said gating combination and to the load resistor, and a plurality of base inputs equal in number to said plurality of switching transistors, at least one of said inputs to the gating combination being connected individually from a base of one of the switching transistors, to the common output of another gating combination, and the emitter of each switching transistor being connected to the constant current source, said constant current source comprising a current mirror including at least the equivalent of a first circuit including a first transistor having a collector connected to the base of the first transistor, means for connecting said collector via a load resistor to a first supply line adapted to be maintained at a first potential level, and a second circuit including a plurality of second transistors having a collector connected to one of the plurality of logical gating combination of switching transistors, means for connecting the emitters of the first and second transistors to a second supply line adapted to be maintained at a second potential level, and means for connecting the bases of the first and second transistors together, said first and said second transistors being of the same conductivity type as the switching transistors, the arrangement of the transistor logic gates being such that the switching transistors do not saturate when conductive, and in relation to the gating combination of switching transistors, the desired logic function is obtained by a constant current flowing through the gating combination of switching transistors as at least one of said switching transistors is switched ON, and substantially no current flows through the logical gating combination of switching transistors as all said switching transistors are switched OFF.

2. A transistor logic circuit as claimed in claim 1 in which the current mirror includes a multi-emitter transistor of the same conductivity type as the switching transistors and having a high inverse current gain value, a first emitter and at least one second emitter associated with each logic gate, means for connecting the first emitter to the first supply line via a load resistor, and to the base of the multi-emitter transistor, the collector of the multi-emitter transistor being connected to the second supply line, and means for connecting the second emitter to the associated logical gating combination of switching transistors, the arrangement of the transistor logic circuit being such that said multi-emitter transistor conducts only in the reverse direction.

3. A transistor logic circuit as claimed in claim 2 in which the transistor with a high inverse current gain value has a plurality of second emitters of equal area at an emitter contact bearing face of the semiconductor body of the multi-emitter transistor and each second emitter is connected individually to an associated one of a corresponding plurality of logical gating combinations of switching transistors.

4. A transistor logic circuit as claimed in claim 2 in which the multi-emitter transistor with a high inverse current gain value has a vertical construction, and has the emitters within a common base, and a base within a common collector.

5. A transistor logic circuit as claimed in claim 2 in which the semiconductor body for the transistor with a high inverse current gain value comprises an epitaxial layer of one conductivity type on a substrate of the same conductivity type, the collector of the transistor including a buried layer of the opposite conductivity type at the interface between the epitaxial layer and the substrate.

6. A semiconductor device embodying in a monolithic semiconductor body a transistor logic circuit which is to be supplied with electrical energy from a low voltage source and the different logic states of which are to be determined by input signals having voltage levels with only a small range of values, the logic circuit including a logic gate including only a logical gating combination of switching transistors connected in parallel with each other, a constant current source arranged to drive said logical gating combination of switching transistors, said gating combination having a common output connected to the collector of each switching transistor and a plurality of inputs, each of said inputs to the gating combination being connected individually to a base of one of the switching transistors, the emitter of each switching transistor being connected to the constant current source for the combination, said constant current source comprising a current mirroring arrangement including a first transistor having a collector connected to the base of the first transistor and via a load resistor to a first supply line adapted to be maintained at a first potential level, and a second circuit including a second transistor having a collector connected via the logical gating combination of switching transistors to the first supply line, means for connecting the emitters of the first and second transistors to a second supply line adapted to be maintained at a second potential level, and means for connecting the bases of the first and second transistors together, said first and second transistors being of the same conductivity type as the switching transistors, the level of the source and arrangement being such that the switching transistors do not saturate when rendered conductive and the desired logic function being obtained by current flowing through the gating combination of switching transistors in a manner such that a constant current flows through the logical gating combination of switching transistors as at least said conducting transistors is switched ON and substantially no current flows through the logical gating combination of switching transistors as all said switching transistors are switched OFF.

7. A semiconductor device as claimed in claim 6 in which the current mirror includes a multi-emitter transistor of the same conductivity type as said switching transistors and having a high inverse current gain value, a first emitter and at least one second emitter associated with each logic gate, means for connecting the first emitter to the first supply line via a load resistor, and to the base of the multi-emitter transistor, the collector of the multi-emitter transistor being connected to the second supply line, and means for connecting the second emitter to the associated logical gating combination of switching transistors, the arrangement of the transistor logic circuit being such that said multi-emitter transistor conducts only in the reverse direction.

8. A semiconductor device as claimed in claim 7 in which the semiconductor body comprises an epitaxial layer of one conductivity type on a substrate of the same conductivity type, at least the transistor with a high inverse current gain value within the constant current source having a collector of the opposite conductivity type comprising both a heavily doped isolation barrier for the transistor and a heavily doped buried layer at the interface between the epitaxial layer and the substrate, the isolation barrier extending through the epitaxial layer into contact with the buried layer.

9. A semiconductor device as claimed in claim 7 wherein said transistor with a high inverse current gain value has a corresponding plurality of second emitters, and each said second emitter being connected individually to an associated one of said plurality of logical gating combinations of switching transistors.

10. A transistor logic circuit which is to be supplied with electrical energy from a low voltage source and the different logic states of which are to be determined by input signals having voltage levels with only a small range of values consisting of a constant current source and a plurality of logic gates each including only a logical gating combination of NPN switching transistors connected in parallel with each other and in series with a load resistor, said load resistor also being connected to a point to be maintained at a predetermined potential level by the low voltage source, said gating combination having a common output connected to the collector of each switching transistor and to the load resistor, and a plurality of base inputs equal in number to said plurality of switching transistors, at least one of said inputs to the gating combination being connected individually from a base of one of the switching transistors to the common output of another gating combination, and the emitter of each switching transistor being connected to said constant current source, said constant current source comprising a current mirror including a first NPN transistor having a collector, a base and an emitter electrode, means for connecting said collector electrode to a first supply line and to the base electrode of said first NPN transistor, a circuit including a second NPN transistor having a collector, a base and an emitter electrode, means for connecting the collector electrode of the second transistor to the emitters of the switching transistors such that said collector electrode is connected to the logical gating combination of switching transistors, means for connecting the emitter electrodes of the first and the second transistors to a second supply line, and means for connecting the base electrodes of the first and the second transistors together, the arrangement of the transistor logic circuit being such that the switching transistors do not saturate when conductive, and in relation to the gating combination of switching transistors, the desired logic function is obtained by a constant current flowing through the gating combination of switching transistors as at least one of said switching transistors is switched ON, and substantially no current flows through the logical gating combination of switching transistors as all said switching transistors are switched OFF.

11. A transistor logic circuit as set forth in claim 10 wherein each said logical gating combination of switching transistors comprises a two input logic gate including one switching transistor for each input.

12. A transistor logic circuit which is to be supplied with electrical energy from a low voltage source and the different logic states of which are to be determined by input signals having voltage levels with only a small range of values consisting of a constant current source and at least two logic gates each including only a gating combination of switching transistors connected in parallel with each other and in series with a load resistor, the load resistor also being connected to a point to be maintained at a predetermined potential level by the low voltage source, said gating combination having a common output connected to the collector of each switching transistor and to the load resistor, and a plurality of base inputs equal in number to said plurality of switching transistors, at least one of said inputs to one of the gating combinations being connected individually from a base of one of the switching transistors to the common output of another gating combination, and the emitter of each switching transistor being connected to said constant current source, said constant current source comprising a current mirror including a multi-emitter transistor of the same conductivity type as the switching transistors and having a high inverse current gain value, a collector, a base and at least two emitter electrodes, means for connecting one emitter electrode to the base electrode of the multi-emitter transistor and to a first supply line, means for connecting the collector electrode of the multi-emitter transistor to a second supply line, and means for connecting each remaining emitter electrode of the transistor individually, to an associated logical gating combination of switching transistors, the arrangement of the transistor logic circuit being such that said multi-emitter transistor is arranged to conduct only in the reverse direction, the switching transistors do not saturate when conductive, and in relation to the gating combination of switching transistors, the desired logic function is obtained by a constant current flowing through the gating combination of switching transistors as at least one of said switching transistors is switched ON, and substantially no current flows through the logical gating combination of switching transistors as all said switching transistors are switched OFF 13. A transistor logic circuit as claimed in claim 12 in which the multi-emitter transistor is of a vertical construction, and has the emitters within a common base, and the base within a common collector.

14. A transistor logic circuit as set forth in claim 12 wherein said multi-emitter transistor includes a plurality of emitter electrodes over and above said one emitter electrode connected to the base electrode of the transistor, and each of said plurality of emitter electrodes being connected individually to an associated one of a corresponding plurality of logical gating combinations of switching transistors, each combination of switching transistors comprising a two input logic gate.

15. A transistor logic circuit as set forth in claim 14 wherein each of said two input logic gates include one switching transistor for each input and wherein said switching transistors are connected in parallel with each other forming a NOR gate.

16. A semiconductor device embodying in a monolithic semiconductor body a transistor logic circuit which is to be supplied with electrical energy from a low voltage source and the different logic states of which are to be determined by input signals having voltage levels with only a small range of values, the logic circuit consisting of a constant current source and at least two logic gates, each logic gate including only a gating combination of NPN switching transistors connected in parallel with each other and in series with a load resistor, the load resistor also being connected to a point to be maintained at a positive potential level by the low voltage source, said gating combination having a common output connected to the collector of each switching transistor and to the load resistor, and a plurality of base inputs equal in number to said plurality of switching transistors, at least one of said inputs to the gating combination being connected individually from a base of one of the switching transistors to the common output of another gating combination, and the emitter of each switching transistor being connected to the constant current source, said cnstant current source comprising a current mirror including an NPN nulti-emitter transistor with a vertical construction, having the emitters within a common base, and the base within a common collector, and having a high inverse current gain value, the constant current source transistor also having a first emitter and at least one second emitter, each said second emitter having the same area at an emitter contact bearing face of the semiconductor body, the current mirror including a first stage and at least one second stage, said first stage including the first emitter connected both to the common base of the constant current source transistor and via a load resistor to a point to be maintained at a first potential level, and the common collector being connected directly to a point to be maintained at a second potential level less positive than the first potential level, and each second stage including a second emitter, the arrangement of the transistor logic circuit being such that the constant current source NPN transistor conducts only in the reverse direction, the switching transistors do not saturate when rendered conductive, and in relation to each gating combination of switching transistors, the desired logic function is obtained by a constant current flowing therethrough as at least one of said switching transistors of the gating combination is switched ON, and substantially no current flows therethrough as all said switching transistors of the gating combination are switched OFF.

17. A semiconductor device as claimed in claim 16 in which the semiconductor body comprises an epitaxial layer of one conductivity type on a substrate of the same conductivity type, the collector of the multi-emitter transistor including a buried layer of the opposite conductivity type at the interface between the epitaxial layer and the substrate, a base region of said one conductivity type within the epitaxial layer, and each emitter within said base region.

18. A semiconductor device as claimed in claim 16 in which the semiconductor body comprises an epitaxial layer of one conductivity type on a substrate of the same conductivity type, said multi-emitter transistor with the high inverse current gain value having a collector of the opposite conductivity type comprising both a heavily doped isolation barrier for the transistor and a heavily doped buried layer at the interface between the epitaxial layer and the substrate, the isolation barrier extending through the epitaxial layer into contact with the buried layer, said collector defining the base within the epitaxial layer, and each emitter being within said base.

19. A semiconductor device as claimed in claim 16 in which within the semiconductor body each said second emitter is uniformly distributed within the base and about the first emitter.

20. A semiconductor device as claimed in claim 16 in which the ratio of the areas at the emitter contact-bearing face of the semiconductor body of th first emitter in relation to each second emitter is other than unity.

21. A semiconductor device as claimed in claim 16 in which the ratio of the areas at the emitter contact bearing face of the semiconductor body of the first emitter in relation to each second emitter is unity.

* * * * *

UNITED STATES PATENT AND TRADEMARK OFFICE
CERTIFICATE OF CORRECTION

PATENT NO. : 4,145,621

DATED : March 20, 1979

INVENTOR(S) : Stephen F. Colaco

It is certified that error appears in the above-identified patent and that said Letters Patent are hereby corrected as shown below:

Column 7, lines 52-68, cancel begining with "6. A semiconductor" to and including "source for the" and Column 8, lines 1-25, cancel beginning with "combination, said" to and including "OFF." and substitute the following claim: --6. A semiconductor device embodying in a monolithic semiconductor body a transistor logic circuit which is to be supplied with electrical energy from a low voltage source and the different logic states of which are to be determined by input signals having voltage levels with only a small range of values, the logic circuit consisting of a plurality of logic gates each including only a logical gating combination of switching transistors connected in parallel with each other and in series with a load resistor, the load resistor also being connected to a point to be maintained at a predetermined potential level by the low voltage source, and a constant current source, said gating combination having a common output connected to the collector of each switching transistor and to the load resistor, and a plurality of base inputs equal in number to said plurality of switching transistors, at least one of said inputs to the gating combination being connected individually from a base of one of the switching transistors to the

UNITED STATES PATENT AND TRADEMARK OFFICE
CERTIFICATE OF CORRECTION

PATENT NO. : 4,145,621

DATED : March 20, 1979

INVENTOR(S) : Stephen F. Colaco

It is certified that error appears in the above-identified patent and that said Letters Patent are hereby corrected as shown below:

common output of another gating combination, and the emitter of each switching transistor being connected to the constant current source, said constant current source comprising a current mirror including a first transistor having a collector connected to the base of the first transistor, and means for connecting said collector via a load resistor to a first supply line adapted to be maintained at a first potential level, and a second circuit including a plurality of second transistors having a collector connected to one of the plurality of logical gating combination of switching transistors, means for connecting the emitters of the first and second transistors to a second supply line adapted to be maintained at a second potential level, and means for connecting the bases of the first and second transistors together, said first and second transistors being of the same conductivity type as the switching transistors, the arrangement of the transistor logic gates being such that the switching transistors do not saturate when conductive, and in relation to the gating combination of switching transistors, the desired logic function is obtained by a constant current flowing through the gating combination of switching transistors as at least one of said switching transistors is

UNITED STATES PATENT AND TRADEMARK OFFICE
CERTIFICATE OF CORRECTION

PATENT NO. : 4,145,621

DATED : March 20, 1979

INVENTOR(S) : Stephen F. Colaco

It is certified that error appears in the above—identified patent and that said Letters Patent are hereby corrected as shown below:

switched ON, and substantially no current flows through the logical gating combination of switching transistors as all said switching transistors are switched OFF. --; Column 10, line 51, claim 16, "cnstant" should read -- constant --.

Signed and Sealed this

Sixteenth Day of October 1979

[SEAL]

Attest:

RUTH C. MASON
*Attesting Officer*

LUTRELLE F. PARKER
*Acting Commissioner of Patents and Trademarks*